Nov. 2, 1954

R. L. OSBORN 2,693,581

HIGH-FREQUENCY TUNER

Filed Sept. 19, 1947

2 Sheets-Sheet 1

INVENTOR.
Raymond L. Osborn
BY Robert L Kahn

Nov. 2, 1954 R. L. OSBORN 2,693,581

HIGH-FREQUENCY TUNER

Filed Sept. 19, 1947 2 Sheets-Sheet 2

INVENTOR.
Raymond L. Osborn
BY
Robert L Kahn

United States Patent Office 2,693,581

Patented Nov. 2, 1954

2,693,581

HIGH-FREQUENCY TUNER

Raymond L. Osborn, Evanston, Ill., assignor to Oak Mfg. Co., Chicago, Ill., a corporation of Illinois Application September 19, 1947, Serial No. 774,925

10 Claims. (Cl. 333—82)

This invention relates to an electrical apparatus and particularly to a tuner of the type utilizing quarter-wave tuning stubs.

In high frequency circuits, the use of an adjustable tuning stub for introducing any desired type and amount of reactance is well known. The use of such tuning stubs depends upon the fact that the two conductors are spaced so close that the distance between them is small in terms of wavelength of operating frequency and also that the contact between relatively movable members has low ohmic resistance.

As a rule, the most practical use of tuning stubs is in connection with a stub having an electrical length of a half wave or less. As is well known, a shorted transmission line less than a quarter wave long has an inductive reactance while the stub over a quarter wave length and less than one-half wavelength has capacitive reactance. For tuning purposes, the circuit in which such stubs are used may be designed so that the variable reactance may be either capacitive or inductive. The present invention provides a tuning means wherein a stub having an electrical length of a quarter wave or less is relied upon for providing a controllable reactance.

While the invention is of general application to high frequency circuits, it is particularly applicable to circuits resonant to frequencies of the order of about 100 megacycles and has been successfully used at frequencies ranging from about 50 megacycles to frequencies of more than 250 megacycles. This frequency range is more than enough to accommodate the frequency modulation band presently assigned and may be used in connection with present television frequencies.

Figure 1:
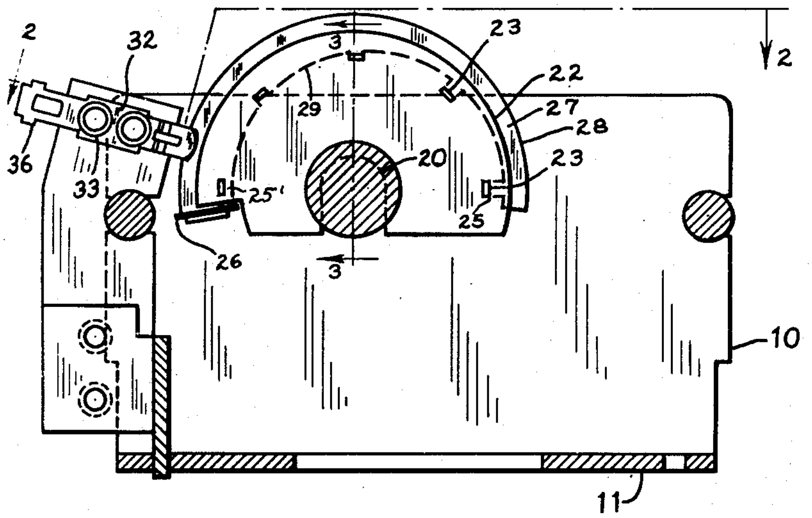
Figure 2:
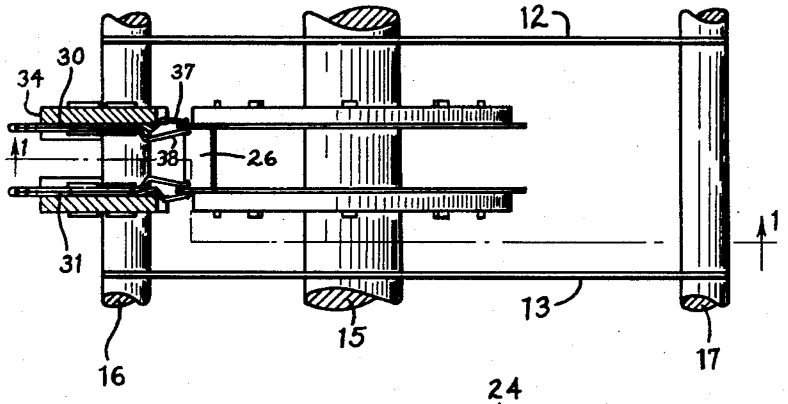
Figure 3:
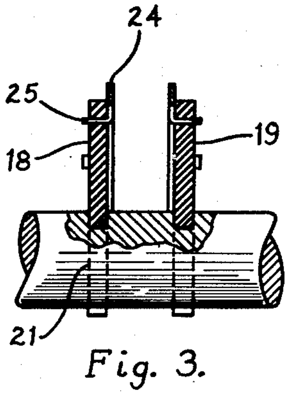
Figures 4, 5, 6, 7, 8, 9:
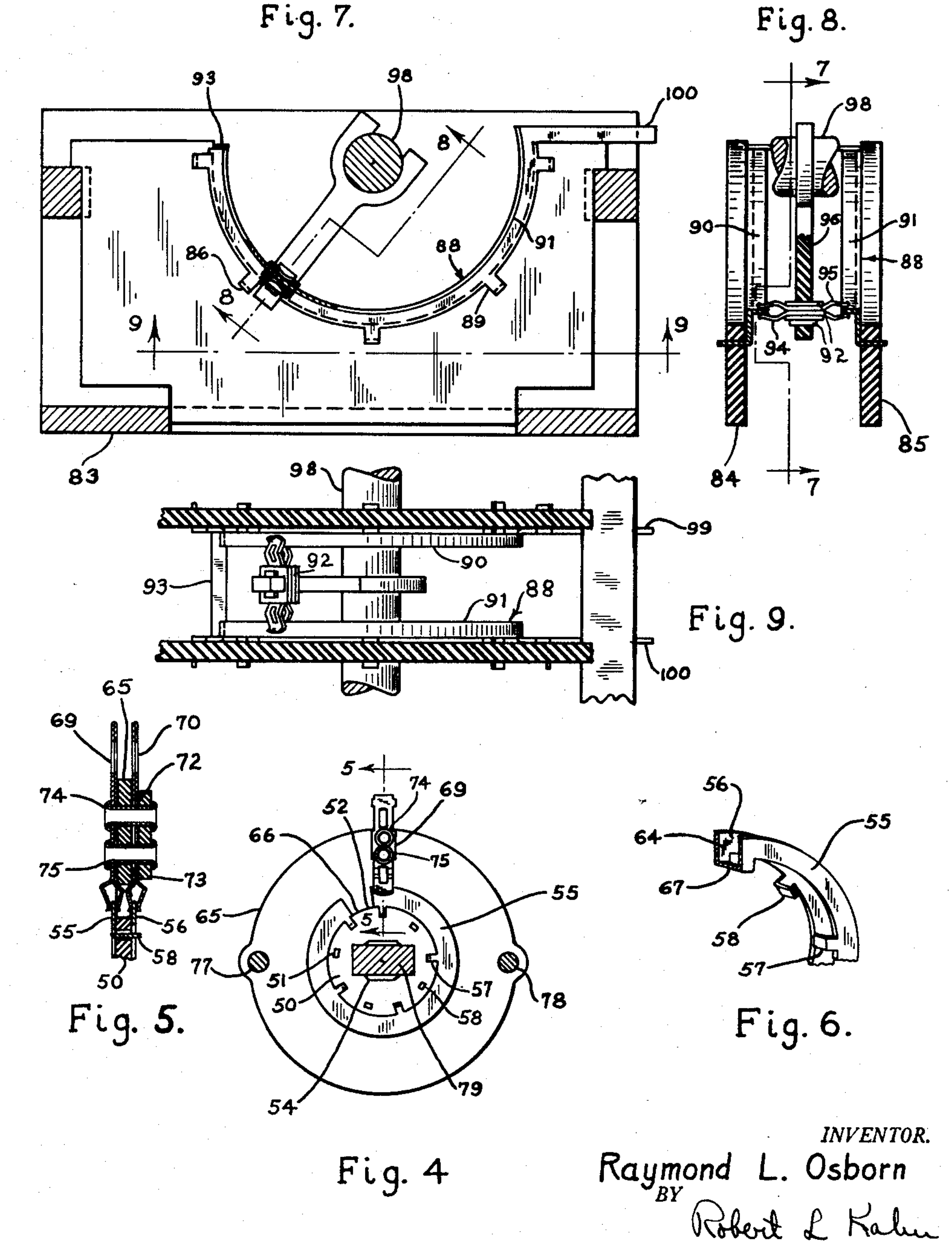

In general, a construction embodying the present invention utilizes one or more insulating discs having conducting material circumferentially disposed on said discs and forming a transmission line. Fixed contacts cooperate with such conducting material, and tuning may be effected by rotation of said discs on a suitable shaft. The elements may be reversed so that the line elements are stationary and the contacts rotate. While various forms of structures may be used in connection with the invention, preferred embodiments are shown in the drawing wherein Figure 1 is a sectional elevation on line 1—1 of Figure 2 showing one form of tuner embodying the present invention. Figure 2 is a sectional view on line 2—2 of Figure 1. Figure 3 is a sectional detail on line 3—3 of Figure 1. Figure 4 is a sectional elevation of a modified tuner. Figure 5 is a sectional detail on line 5—5 of Figure 4. Figure 6 is a perspective detail showing part of the open line construction of Figure 4. Figure 7 is a sectional elevation on line 7—7 of Figure 8 of another modified form of tuner. Figure 8 is a section on line 8—8 of Figure 7. Figure 9 is a sectional view on line 9—9 of Figure 7.

Referring now to the drawings, frame 10 of any suitable material has bottom 11 and side plates 12 and 13. While the frame may either be of insulating or conducting material, it is preferred to make the frame of conducting material. This frame may conveniently be of steel and similar to the frames used in the manufacture of gang condensers for use in conventional home-type radio receivers.

Journalled for rotation in suitable bearings and passing through plates 12 and 13 is shaft 15, which may also be either of insulating material or metal. This shaft is most conveniently of metal, and the entire shaft and frame structure together with the bearings may be identical with that general in gang condensers. Joining plates 12 and 13 and forming part of the entire frame are stiffening rods 16 and 17, this also being general in condensers. For convenience, only one section of a tuner will be described in detail with the understanding, however, that as many sections may be provided as are necessary, this being similar to the various sections of a condenser making up a gang. Each tuner section may be shielded by side plates.

One section of a tuner comprises a pair of insulating discs 18 and 19 suitably mounted upon shaft 15 to rotate therewith. These discs may have any desired angular extent depending upon the physical length of tuning stub and are preferably formed of rigid insulating material, such as Bakelite, porcelain, glass or fiber. As shown here, each disc is mutilated and slotted at 20 and is adapted to be forced over grooves 21 cut in shaft 15. Any other mounting may be used. Each disc has peripheral portion 22 and has preformed therein regularly spaced apertures 23 spaced from the edge of the disc.

Carried by each disc is transmission line conducting element 24 in the form of a flat curved strip extending beyond the disc edge and having mounting tongues 25 at regularly spaced intervals. Tongues 25 register with apertures 23 and pass through the same to be peaned or spread on the other side of the disc to lock the tongue in the disc material. Certain tongues may extend inwardly of the line element while others as 25' may be punched from the body of the line element. Each line element may be riveted or fastened in any other desired manner to a disc. The disc and line element may be formed as a moulded unit if desired. The angular extent along the disc of each transmission line element may be as great or as little as desired, and may be something less than 360 degrees. Each disc 18 and 19 has one element of the line. The line is short-circuited by shorting bar or link 26 firmly secured to an end of each of the conductor elements. It is preferred to have conducting elements 24 of any material having a silver or good conducting surface. Shorting bar 26 is preferably soldered to the ends so that excellent electrical contact at the shorting bars is provided.

Each line element has free circular edge portion 27 extending beyond the disc edge with edge 28 concentric with shaft 15. While each line element may have a uniform width radially thereof, the invention contemplates a variable width. Thus as shown, a line element has inner edge 29 so shaped as to provide for a continuously increasing width. It is preferred to have the minimum width at the end of the line remote from the shorting link. The variation in width may be continuous or not and may follow any desired formula or curve. By varying the width of the line elements, the line constants are varied. Thus a suitable type of scale calibration may be secured. This is analogous to shaping condenser plates for obtaining straight line frequency scales. As shown here, inner edge 29 of the line elements is circular with respect to a different point than the shaft center and a straight line characteristic of frequency against angle of rotation may be obtained.

Cooperating with each element of the transmission line are spring contacts 30 and 31 respectively. These contacts may have any suitable construction but preferably have the construction shown in the drawing. This construction generally comprises mounting portion 32 suitably apertured to accommodate one or more eyelets 33 for securing the fixed contacts to insulating supports 34. Mounting portion 32 has lug portion 36 to which wire leads may be attached by soldering. Mounting portion 32 also carries spring jaws 37 and 38 bent as shown and adapted to embrace the free portion of the line element on opposite sides thereof. The fixed contacts are preferably made of suitable spring material, such as phosphor bronze and may be silvered for providing good electrical contact with the annular line element.

The mounting discs and constant width line element together with cooperating fixed spring contact for switches are described and claimed in Patents 2,186,949 and 2,186,950 granted January 16, 1940. As pointed out in such patents, line elements 23 may be formed in any desired length.

It is evident that rotation of shaft 15 will vary the electrical length of the line connected to fixed contacts 30 and 31. To this length of line must be added the length of leads or other circuit element functioning as part of a transmission line. In practice, such leads may be of the order of about one or two inches, although the leads may be longer or shorter as desired. A condenser across the leads may be used for increasing the electrical length of the line. In general, the shorter the length of lead attached to contacts 30 and 31, the greater will be the tuning range of a tuning section. It is understood, of course, that the position in the frequency spectrum will also be varied by controlling the length of lead.

Referring now to Figures 4, 5 and 6, a modification is shown wherein a tuning section has substantially smaller dimension transverse to the insulating disc than the structure shown in the preceding figures. Thus, referring to these figures, insulating disc 50 is provided with a series of apertures 51 regularly disposed adjacent peripheral portion 52 thereof. Disc 50 may be of any suitable insulating material such as polystyrene, porcelain or Bakelite, and may have non-circular aperture 54 at the center thereof for engagement with a correspondingly shaped shaft portion for rotation. Disc 50 carries transmission line elements 55 and 56, each consisting of a flat annular strip of metal extending beyond the disc edge and having inwardly extending tongues 57 and 58 respectively. Tongues 57 of one disc are angularly staggered with respect to tongues 58 of the other disc so that the two transmission elements may be mounted on opposite sides of disc 50 while maintaining the two mounting elements electrically distinct. Transmission line elements 55 and 56 are preferably similar to each other and have their ends axially aligned. As is clearly evident, transmission line elements 55 and 56 extend beyond the edge of disc 50 and defined annular region 64. Insulating plate 65 having interior circular portion 66 is provided, the circular cut-out being small enough so that transmission line elements 55 and 56 lie against the opposite sides of insulating plate 65. Thus, disc 50 and insulating plate 65 are maintained as a unitary assembly removable or replaceable with respect to a ganged number of units. This construction is disclosed and claimed for electric switches in the patent previously referred to.

Shorting bar or link 67 is provided at the aligned ends of one of the transmission line elements. This shorting bar passes through one of the mounting apertures in disc 50 and is permanently joined to both transmission line elements. While the line elements are shown as constant in width, they may taper as in Figure 1.

Carried by plate 65 are spring contacts 69 and 70 generally similar to contacts 32 and 33 of Figures 1 to 3 inclusive. In order to electrically isolate one contact from the other while utilizing a common mounting means, one of the contacts here shown as 70 is preferably provided with enlarged apertures 72 and mounting block 73 of insulating material. Eyelets 74 and 75 may pass through the aligned fixed contacts for maintaining the two rigidly in position. This construction is disclosed and claimed in Patent 2,128,279 granted August 30, 1938.

The tuning section may be mounted in any suitable manner such as on rods 77 and 78 passing through suitable apertures in insulating plate 65. These rods may be part of any suitable tuning means and may have suitable end plates and shaft 79 journalled therein. The construction disclosed in the patents previously referred to may be used for mounting a complete tuning assembly. Adjacent tuning assemblies may be shielded by metal spacer plates in a manner well known in the art.

In the constructions previously described, the line elements have been rotated and contacts cooperating with such line elements have been stationary. It is clear that this may be reversed to provide stationary line elements and movable contacts. One example of such a construction is disclosed in Figures 7 to 9 inclusive, wherein frame 83 of any desired construction is provided. This frame may resemble the frame shown in Figure 1 and be generally similar to the framework used in gang condenser construction. A tuning section comprises a pair of insulating plates 84 and 85 parallel and spaced from each other a suitable distance. These plates may be supported in spaced relation in any suitable fashion. Inasmuch as these two plates are of similar construction, only one will be described in detail.

Plate 85 has arcuate series of slots 86 formed therein. Arcuate series of slots 86 may have any desired angular extent up to 360 degrees. As shown here, an angular extent of the order of about 180 degrees is provided. This, however, is exemplary. Annular line elements 88 having tongues 89 are disposed along slot portions 86. The tongues extend through slots for retaining the line elements rigidly in position. The line elements have contact portions 90 and 91 bent to extend out from supporting plates 84 and 85. Shorting element 93 is provided at one end of the line elements but may be omitted. Cooperating with contact portions 90 and 91 of the line elements are spring clips 94 and 95 of any desired construction. These clips are of any suitable construction extending between opposed contact portions 90 and 91 and are locked in insulating arm 96 carried by shaft 98. Thus the clips may have retaining wedges 92 slipped over arm 96 on opposite sides of the clips and the wedges locked together by friction. Thus a movable short across the line elements is provided. Leads 99 and 100 are taken from the free ends of the line elements and may go to any desired circuit. The line elements in these figures may also be tapered as desired.

As many sections of a tuner may be provided for control by one shaft as may be found desirable or necessary. The shaft itself may have associated therewith any desired indexing means for disposing the tuning elements in any one of a number of predetermined positions. The tuning means may be operated either manually or by any preselector or push-button type of tuner. As an example, the preselector shown in Patent 2,161,183, granted June 6, 1939, may be advantageously used with such a tuner. It is understood that a preselector will differ from the same construction used for condensers with respect to the range of travel. In a gang condenser, the preselection range on the condenser shaft is somewhat less than 180 degrees. In a tuner of the type described herein, the rotational range of the shaft may be anything up to almost 360 degrees. Indexing means may also be used.

What is claimed is:

1. A continuously variable tuning means for circuits having currents in the megacycle frequency range, said tuning means comprising a frame having a shaft journalled for rotation therein, at least one insulating disc supported on said shaft and rotated thereby, two flat conductors disposed along the edge of said disc on opposite sides thereof and extending beyond the disc edge and having an angular extent of less than 360 degrees, a fixed contact for each conductor carried by said frame embracing each conductor and making contact therewith on both sides, and a shorting bar connecting said conductors at an end, said conductors and disc being so proportioned that together with leads to said fixed contacts a quarter-wave tuning line is provided, said tuning being accomplished by rotation of said shaft and movement of said conductors with respect to said fixed contacts, said conductors being free of lumped inductance and capacitance so that tuning may be effective over the entire length of conductors.

2. The structure according to claim 1 wherein said insulating disc has a series of apertures and wherein each conductor has tongues extending into said apertures for mounting the conductors, the tongues of one conductor being staggered with respect to the tongues of the other conductor.

3. In a tuner for high frequencies such as used in television, the combination of a pair of similar flat arcuate conductors, said conductors having their flat sides radially thereof, means for mounting said conductors so that they are disposed in opposed relation with the distance between them being small enough so that at the frequencies used radiation effects between conductors are substantial, a metallic permanent short-circuit at one pair of opposed conductor ends only with the other opposed conductor ends being open, means for mounting said conductors to maintain them in rigid relation to each other, a tuning contact for each conductor, means for maintaining said two contacts in predetermined opposed relation, said contacts being adapted to be connected to circuits to be tuned, and means for obtaining relative motion between said conductors on the one hand and contacts on the other, said conductors being free of lumped inductance and capacitance so that tuning may be effective over the entire length of conductors.

4. In a tuner for high frequencies such as used in television, the combination of a pair of flat arcuate conductors, said conductors being similar and having their flat sides radially thereof, means for mounting said conductors so that they are disposed in opposed parallel relation, a permanent metallic short-circuit at one pair of conductor ends only with the other pair of conductor ends being open, a fixed tuning contact for each conductor, said contacts being adapted to be connected to outside circuits to be tuned, and means for rotating said conductors relative to said contacts, said conductors being free of lumped inductance and capacitance so that tuning may be effective over the entire length of conductors.

5. In a tuner for high frequencies such as used in television, the combination of a pair of rigid insulating discs, an arcuate flat conductor for each disc secured thereon, said conductors being similar and means for mounting said discs so that said conductors are disposed in opposed parallel relation with the flat sides of said conductors being radially thereof, a fixed tuning contact for each conductor, means for rotating said discs with respect to said fixed contacts, and a fixed permanent metallic connection between one end only of a conductor and the opposed end only of the other conductor, said conductors being free of lumped inductance and capacitance so that tuning may be effective over the entire length of conductors.

6. A tuner for high frequencies such as used in television comprising a frame having a shaft rotatably mounted therein, at least two insulating discs rigidly secured on said shaft in spaced parallel planes, at least one arcuate flat metal conductor for each disc, said conductor extending clear of the disc material with the flat sides extending radially thereof, a single fixed tuning contact for each arcuate conductor, means for securing said fixed contacts in aligned relation along the shaft axis, and circuit means including a fixed permanent metallic connection between the opposed ends of each pair of conductors, each pair of conductors having the other end thereof open, said conductors being disposed in sufficiently close relation so that radiation effects between conductors are substantial, said conductors being free of lumped inductance and capacitance so that tuning may be effective over the entire length of conductors.

7. In a tuner for high frequencies such as used in television, the combination of a frame having a shaft journalled for rotation therein, two insulating discs supported on said shaft and rotated thereby, a flat conductor disposed along the edge of each disc, said two conductors being similar and having their flat sides radially thereof and being angularly alined and having an angular extent of less than 360°, said discs and conductors being mounted in side-by-side opposed relation with the distance between them being small enough so that at the frequencies used radiation effects between the conductors are substantial, a metallic permanent short-circuit at one pair of opposed conductor ends only with the other opposed conductor ends being open, a fixed tuning contact for each conductor carried by said frame and embracing the conductor and making contact therewith on both sides, said two tuning contacts being disposed in opposed relation and being adapted to be connected to circuits to be tuned, said conductors being free of lumped inductance and capacitance so that tuning may be effected over the entire length of conductors.

8. The tuner according to claim 7 wherein said conductors have surfaces whose area varies along the length of line whereby the ratio of rotary movement against frequency is different from a line having uniform conducting surfaces.

9. The tuner according to claim 7 wherein said conducting elements have conducting surfaces whose area per unit length varies from a minimum at the open end of the line to a maximum at the short-circuited end of the line.

10. The tuner according to claim 7 wherein said conducting elements have surfaces whose area per unit length varies continuously from a minimum to a maximum over the length of the line.

References Cited in the file of this patent

UNITED STATES PATENTS

| Number | Name | Date |
|---|---|---|
| 2,113,758 | De Vries et al. | Apr. 12, 1938 |
| 2,126,541 | De Forest | Aug. 9, 1938 |
| 2,246,928 | Schick | June 24, 1941 |
| 2,292,254 | Van Beuren | Aug. 4, 1942 |
| 2,367,693 | Segerstrom | Jan. 23, 1945 |
| 2,404,399 | Pickles | July 23, 1946 |
| 2,551,228 | Achenbach | May 1, 1951 |